(12) United States Patent
Kunert

(10) Patent No.: US 8,007,292 B2
(45) Date of Patent: Aug. 30, 2011

(54) COMPONENT HAVING A MECHANICAL CONTACT AND METHOD FOR PRODUCING THE COMPONENT

(75) Inventor: Peter Kunert, Lichtenstein (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 12/541,667

(22) Filed: Aug. 14, 2009

(65) Prior Publication Data

US 2010/0048044 A1 Feb. 25, 2010

(30) Foreign Application Priority Data

Aug. 25, 2008 (DE) .......................... 10 2008 041 497

(51) Int. Cl.
*H01R 12/00* (2006.01)
(52) U.S. Cl. .......................................... 439/83; 439/572
(58) Field of Classification Search .................... 439/82, 439/83, 572, 751, 936
See application file for complete search history.

(56) References Cited

U.S. PATENT DOCUMENTS

| | | | |
|---|---|---|---|
| 3,864,014 A * | 2/1975 | Lynch | 439/389 |
| 3,915,546 A * | 10/1975 | Cobaugh et al. | 439/876 |
| 4,767,344 A * | 8/1988 | Noschese | 439/83 |
| 5,029,748 A * | 7/1991 | Lauterbach et al. | 228/180.1 |
| 5,046,957 A * | 9/1991 | Millhimes | 439/83 |
| 6,179,631 B1 * | 1/2001 | Downes et al. | 439/83 |
| 6,896,526 B2 * | 5/2005 | Pitzele | 439/83 |
| 6,997,757 B2 * | 2/2006 | Roshardt | 439/751 |
| 7,281,931 B2 * | 10/2007 | Miyazaki et al. | 439/91 |
| 7,535,723 B2 * | 5/2009 | Belopolsky | 361/760 |

* cited by examiner

*Primary Examiner* — Thanh-Tam T Le
(74) *Attorney, Agent, or Firm* — Kenyon & Kenyon LLP

(57) ABSTRACT

A component having a mechanical contact for connecting the component to a carrier, particularly a printed-circuit board, a coating made of an adhesive material being formed on the contact; the adhesive material containing an encapsulated adhesive substance. A method for producing a component to be mounted on a carrier, particularly on a printed-circuit board; the component being provided with a mechanical contact for connecting the component to the carrier; a coating made of an adhesive material being applied to the contact; the adhesive material having an encapsulated adhesive substance.

8 Claims, 2 Drawing Sheets

COMPONENT HAVING A MECHANICAL CONTACT AND METHOD FOR PRODUCING THE COMPONENT

BACKGROUND INFORMATION

Components and methods for producing a component are known from the related art, in which a component has an electrical contact and the component is plugged with its electrical contact into an opening in a printed-circuit board. In the process, the electrical contact is squeezed and connected to the printed-circuit board by form locking. In this way, a mechanical and an electrical connection are produced between the component and the printed-circuit board.

This press-in technique is used, for example, for connecting sensor housings to printed-circuit boards. The force required for firmly holding the printed-circuit board is determined predominantly by the number of press-in contacts. The requirement for space for a design is decreasing, based on the ever-increasing miniaturization of sensors. The size of the printed-circuit board required is increasingly being determined by the space requirement of the electrical contacts. Therefore, the number of contacts should be as low as possible.

SUMMARY OF THE INVENTION

It is an object of the present invention to provide a component having a contact which is able to be connected to a carrier at a high retention force.

In addition, it is an object of the present invention to provide a method for producing a component that is able to be connected to a carrier at a high contact force.

One advantage of the component according to the present invention is that the contact is provided with an adhesive material that has an encapsulated adhesive substance. In this way, the component is able to be provided with the adhesive substance and stored. The component is mounted on a carrier only at a later time, at which time adhesion takes place. This makes the component suitable for simple and cost-effective mass production.

One advantage of the method according to the present invention is that a component is produced which is able to be connected at a later time to a carrier, at a high retention force. This advantage is achieved by the component's having a contact to which a layer having an adhesive material is applied, the adhesive material having an encapsulated adhesive substance. In this manner, the component is able to be produced independently in time from the assembly with the carrier.

In a further specific embodiment, the adhesive material has a lacquer layer. This provides a secure covering of the adhesive substance. The lacquer also provides a secure protection against mechanical damage of the adhesive material.

In yet another specific embodiment, the adhesive substance has an acrylate system that is enclosed by a polymer layer. This provides a simple and secure adhesive system.

In still another specific embodiment, the contact is developed at the same time as an electrical press-in contact. This makes possible both the electrical and the mechanical contacting to a contact.

In a further specific embodiment, the component is adhered to a printed-circuit board, the contact being plugged into an opening in the printed-circuit board, and a part of the occluded adhesive substance being exposed, and an adhesive connection is provided between the contact and the printed-circuit board. In this way, a mechanical connection is provided having a great retention force between the printed-circuit board and the component. Consequently, the number of contacts may be reduced.

The component may be developed, for example, as a component for a motor vehicle, especially as an integrated circuit, for instance, in the form of a control device or a sensor.

By using a lacquer as matrix for the encapsulated adhesive substance, the adhesive material may be applied with the aid of a usual lacquer coating apparatus. The hardening of the lacquer brings about a dry and robust coating enabling a firm grip.

The dried coating may be stored for several years, in a normal climate. Thus, a linking in time for further processing of the component becomes unnecessary.

DETAILED DESCRIPTION

Figure 1:
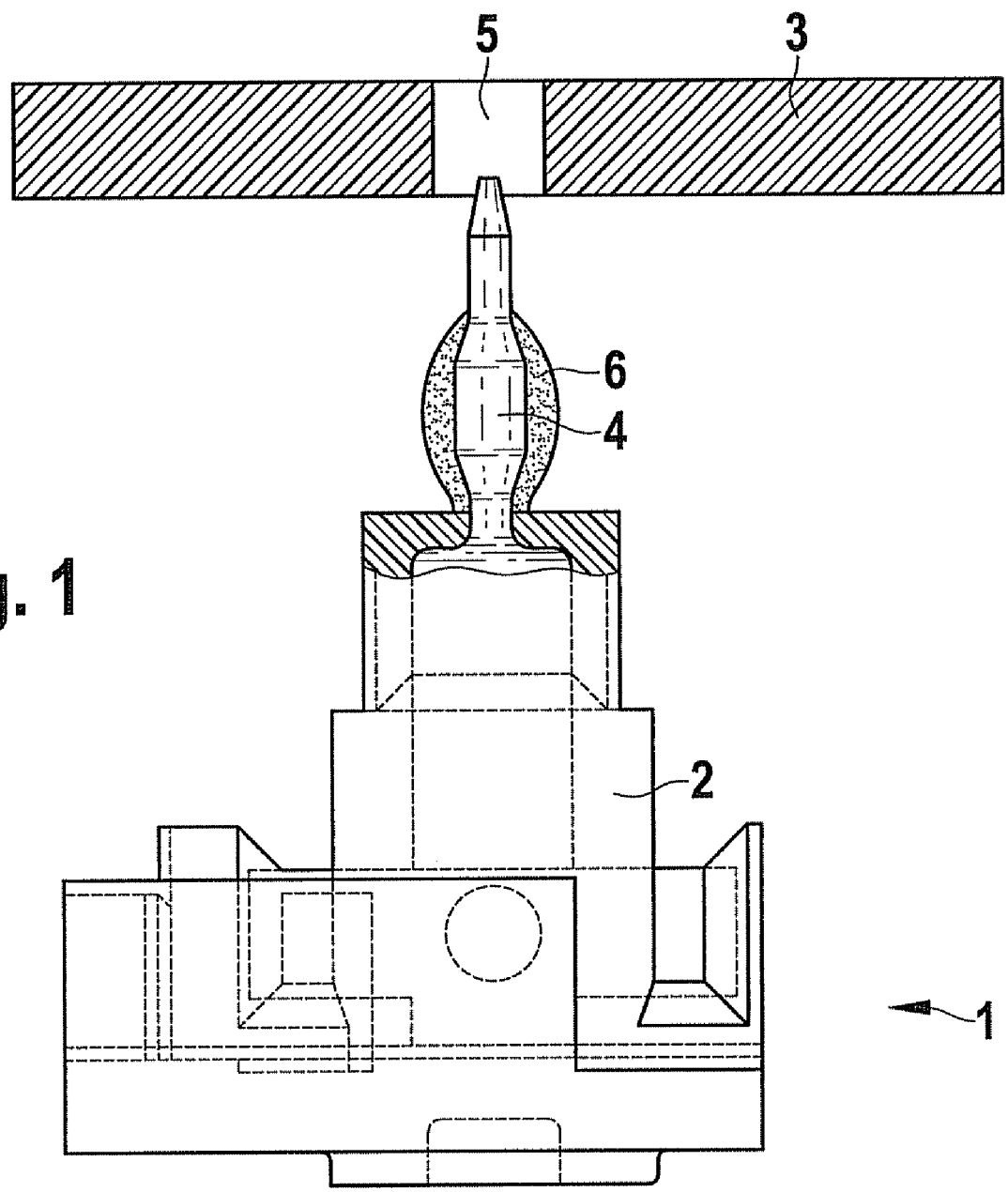
FIG. 1 shows a component and a printed-circuit board before assembly.

A component 1 is schematically shown in FIG. 1. Component 1 may be developed, for example, in the form of a sensor, especially in the form of a rotation-rate sensor or a side air bag sensor. Furthermore, component 1 may be developed in the form of an electrical or integrated circuit, such as in the form of a control unit. Component 1 has a housing 2, which is developed in the form of a pre-mold housing, for example. In housing 2, the sensor and the integrated circuit, or a combination of integrated circuit and sensor or an electrical circuit is developed.

Component 1 has a contact 4 for the electrical and/or mechanical fastening of component 1 on a carrier, such as on a printed-circuit board 3 having an opening 5. Contact 4, for instance, is used only as a mechanical contact and/or as an electrical contact so as to form an electrical connection between printed-circuit board 3 and component 1. Contact 4 may be developed in the form of an electrical press-in contact, for example. Printed-circuit board 3 has an opening 5. Contact 4 is developed in the form of a metal pin, for example. In addition, contact 4 is provided at least partially with a coating 6.

Figure 2:
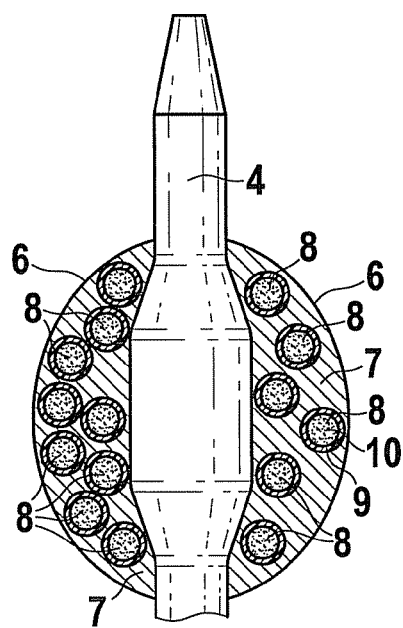
FIG. 2 shows a schematic representation of a coating of a contact.

In a schematic and enlarged partial view of contact 4, FIG. 2 shows an exemplary composition of coating 6. Coating 6 has a matrix material 7, in which encapsulated adhesive material 8 is embedded. Encapsulated adhesive material 8 has an adhesive substance 10 which is surrounded by a casing 9. Adhesive substance 10 may be an acrylate system, for example, which is surrounded by a polymer layer in the form of casing 9. Thus, microcapsules are provided that are embedded in matrix material 7. A lacquer may be used as matrix material 7, for example. However, instead of lacquer, other types of matrix material may be used which enable the embedding of encapsulated adhesive material 8. Instead of the acrylate system, one may also use other adhesive substance systems. In an adhesive system that has two adhesive components, the adhesive components are situated in separate microspheres. Only when casings 9 are opened are the two components able to react with each other and produce an adhesive compound.

Coating 6 is applied onto contact 4 by painting it on or by spraying it on. When lacquer is used as matrix material 7, the usual lacquering equipment may be used.

After the hardening of matrix material 7, particularly of the lacquer, a dry and robust coating 6 is created enabling a firm grip. The encapsulated adhesive substance spheres are protected by the robust coating. The coating of the contacts may take place directly after the production of the housing, for example. The dried coating may be stored for several years. Thus, a linking in time for further processing of the component becomes unnecessary.

Figure 3:
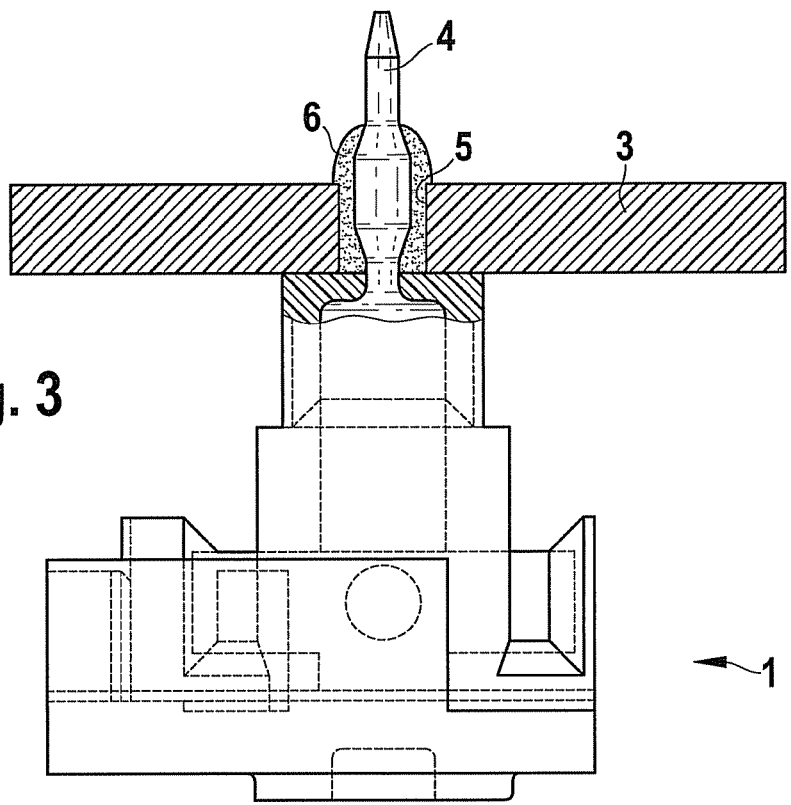
FIG. 3 shows a component connected to the printed-circuit board.

FIG. 3 shows a component 1 that is mounted onto printed-circuit board 3. To do this, a contact 4 having coating 6 has been pushed into opening 5. When it is pushed in, matrix material 7 is displaced, and casings 9 are opened by the pressure between printed-circuit board 3 and contact 4. Adhesive substance 10 is exposed by this. Adhesive substance 10 now forms an adhesive connection between contact 4 and printed-circuit board 3 or a printed-circuit board overlay. No additional activating mechanisms are required that are dependent on the adhesive system used.

Because of the pressure and shearing loads created by the press-in process, the encapsulated adhesive spheres, or rather their casings, are destroyed, and the liquid content mixes in when a two-component adhesive is used. This causes a chemical reaction of the components by polymerization. As a result, the adhesive substance system hardens and forms an adhesive connection between the component parts involved, especially between contact 4 and printed-circuit board 3.

Depending on the adhesive components used, additional activating mechanisms such as temperature or UV light may also be applied to harden the adhesive substance.

After the press-in process, the production process flow may be continued in an unrestricted manner. The hardening time of the adhesive connection may amount to 6 to 12 hours. The hardening time may be adjusted by the selection of the acrylate components.

The coefficient of friction of coating 6 may be specifically influenced and lowered by the suitable selection of a lacquer material, so that the minimization of the coefficient of friction that is required for the press-in process may be ensured.

The adhesive system may have, for instance, a liquid plastic and a hardener, which are each encapsulated in a thin polymer wall and embedded in a carrier system. In this context, the polymer walls form small spheres in which the liquid plastic and the hardener are encapsulated separately. When the component is plugged into the carrier, at least one part of the spheres is opened by the pressure being created, so that the plastic and the curing agent are mixed together. In addition, a chemical reaction is created which, after a curing time, leads to the adhesion of the contact to the printed-circuit board.

Appropriate adhesive systems are being marketed, for example, under the product designation Loctite-Dri Loc by the firm of Loctite, Loctite and Loctite-Dri Loc being registered trade trademarks. An appropriate adhesive system is also being marketed under the product designation SCOTCH GRIP-3M No. 2451 by the firm of 3M.

What is claimed is:

1. A component comprising:
   a mechanical contact for connecting the component to a carrier; and
   a coating made of an adhesive material and situated on the contact prior to connecting the component to the carrier, the contact in the form of a pin, the adhesive material containing an encapsulated adhesive substance, wherein the coating contains spheres of the encapsulated adhesive substance, the spheres surrounded by casings,
   wherein the encapsulated adhesive substance is exposed when the contact and the coating are plugged into an opening of the carrier, the adhesive material is displaced and the casings are opened by a pressure between the contact and the carrier, and the exposed adhesive substance forms an adhesive connection between the contact and the carrier;
   wherein the coating has a lacquer layer; and
   wherein the adhesive substance has an acrylate system and the casings made of polymer.

2. The component according to claim 1, wherein the carrier is a printed-circuit board.

3. The component according to claim 1, wherein the contact is an electrical press-in contact.

4. The component according to claim 1, wherein the carrier is a printed-circuit board, and wherein the contact is adhered together with the printed-circuit board with the aid of the adhesive material.

5. The component according to claim 1, wherein the component is one of an integrated circuit, a control unit, and a sensor, for a motor vehicle.

6. A method for producing a component to be mounted on a carrier, comprising:
   providing the component with a mechanical contact for connecting the component to the carrier; and
   applying a coating made of an adhesive material to the contact prior to connecting the component to the carrier, the contact in the form of a pin, the adhesive material having an encapsulated adhesive substance, wherein the coating contains spheres of the encapsulated adhesive substance, the spheres surrounded by casings,
   wherein the encapsulated adhesive substance is exposed when the contact and the coating are plugged into an opening of the carrier, the adhesive material is displaced and the casings are opened by a pressure between the contact and the carrier, and the exposed adhesive substance forms an adhesive connection between the contact and the carrier;
   wherein the coating has a lacquer layer; and
   wherein the adhesive substance has an acrylate system and the casings made of polymer.

7. The method according to claim 6, wherein the carrier is a printed-circuit board.

8. The method according to claim 6, wherein the adhesive material has spheres of acrylate systems covered with a polymer layer.

* * * * *